(12) United States Patent
Park et al.

(10) Patent No.: US 9,722,172 B2
(45) Date of Patent: Aug. 1, 2017

(54) ELECTRONIC DEVICE AND METHOD FOR FABRICATING THE SAME

(71) Applicant: SK hynix Inc., Icheon-Si (KR)

(72) Inventors: Ki-Seon Park, Icheon-si (KR); Bo-Mi Lee, Icheon-Si (KR); Won-Joon Choi, Icheon-Si (KR); Guk-Cheon Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 95 days.

(21) Appl. No.: 14/789,798

(22) Filed: Jul. 1, 2015

(65) Prior Publication Data

US 2016/0149120 A1    May 26, 2016

(30) Foreign Application Priority Data

Nov. 24, 2014   (KR) .................. 10-2014-0164523

(51) Int. Cl.
   *G06F 12/00*   (2006.01)
   *H01L 43/08*   (2006.01)
   *H01L 43/02*   (2006.01)
   *H01L 43/12*   (2006.01)
   *G06F 1/32*    (2006.01)

(52) U.S. Cl.
   CPC ............ *H01L 43/08* (2013.01); *G06F 1/3275* (2013.01); *H01L 43/02* (2013.01); *H01L 43/12* (2013.01)

(58) Field of Classification Search
   CPC ... G06F 12/0815; G06F 1/3275; H01L 43/08; H01L 43/02; H01L 43/12

USPC ......................................... 711/126
See application file for complete search history.

(56) References Cited

U.S. PATENT DOCUMENTS

| 8,779,406 B2* | 7/2014 | Ito ..................... H01L 45/145 257/2 |
| 8,860,157 B2* | 10/2014 | Zheng ................ H01F 10/30 257/421 |
| 9,136,005 B2* | 9/2015 | Choe ................... G11C 16/14 |
| 2013/0248801 A1* | 9/2013 | Yamamoto ........... H01L 27/249 257/4 |

(Continued)

FOREIGN PATENT DOCUMENTS

| KR | 10-2005-0030785 A | 3/2005 |
| KR | 10-2009-0119814 A | 11/2009 |

(Continued)

*Primary Examiner* — Pierre-Michel Bataille
(74) *Attorney, Agent, or Firm* — Perkins Coie LLP

(57) ABSTRACT

This technology provides an electronic device and a method for fabricating the same. An electronic device in accordance with an implementation of this document includes semiconductor memory, and the semiconductor memory includes an interlayer dielectric layer formed over a substrate and having a hole; a conductive pattern filled in the hole and having a top surface located at a level substantially same as a top surface of the interlayer dielectric layer; and an MTJ (Magnetic Tunnel Junction) structure formed over the conductive pattern to be coupled to the conductive pattern and including a free layer having a variable magnetization direction, a pinned layer having a pinned magnetization direction and a tunnel barrier layer interposed between the free layer and the pinned layer, wherein an upper portion of the conductive pattern includes a first amorphous region.

20 Claims, 12 Drawing Sheets

(56) References Cited

U.S. PATENT DOCUMENTS

| | | | | |
|---|---|---|---|---|
| 2014/0124881 A1* | 5/2014 | Kwon | ................. | H01L 43/08 |
| | | | | 257/421 |
| 2015/0249096 A1* | 9/2015 | Lupino | ............. | H01L 27/11898 |
| | | | | 257/203 |
| 2016/0104746 A1* | 4/2016 | Lim | ................. | H01L 27/2409 |
| | | | | 438/478 |

FOREIGN PATENT DOCUMENTS

| KR | 10-2011-0094045 A | 8/2011 |
|---|---|---|
| KR | 10-2012-0091804 A | 8/2012 |

\* cited by examiner

ELECTRONIC DEVICE AND METHOD FOR FABRICATING THE SAME

CROSS-REFERENCE TO RELATED APPLICATION

This patent document claims priority of Korean Patent Application No. 10-2014-0164523, entitled "ELECTRONIC DEVICE AND METHOD FOR FABRICATING THE SAME" and filed on Nov. 24, 2014, and published on Jun. 1, 2016 as Korean Patent Publication No. 10-2016-0067146, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device facilitates fabricating processes and can secure characteristics of a variable resistance element.

In one aspect, an electronic device is provided to include semiconductor memory that includes an interlayer dielectric layer formed over a substrate and having a hole; a conductive pattern filled in the hole and having a top surface located at a level substantially same as a top surface of the interlayer dielectric layer; and an MTJ (Magnetic Tunnel Junction) structure formed over the conductive pattern to be coupled to the conductive pattern and including a free layer having a variable magnetization direction, a pinned layer having a pinned magnetization direction and a tunnel barrier layer interposed between the free layer and the pinned layer, wherein an upper portion of the conductive pattern includes a first amorphous region.

Implementations of the above electronic device may include one or more the following.

The first amorphous region includes Ge, Ar, Xe, In, Sb or As as a dopant. An upper portion of the interlayer dielectric layer includes a second amorphous region. The second amorphous region includes Ge, Ar, Xe, In, Sb or As as a dopant. The upper portion of the conductive pattern and the upper portion of the interlayer dielectric layer have the same dopant. The upper portion of the conductive pattern and the upper portion of the interlayer dielectric layer have the substantially same thickness. The MTJ structure covers the whole top surface of the conductive pattern. The conductive pattern includes a first conductive pattern filling a lower portion of the hole and a second conductive pattern filling an upper portion of the hole, and the second conductive pattern forms a variable resistance element together with the MTJ structure. The upper portion of the conductive pattern corresponds to a part or a whole of the second conductive pattern. The hole includes a first hole and a second hole located over the first hole, the second hole has a sidewall which is not aligned with the first hole, the first conductive pattern is filled in the first hole, and the second conductive pattern is filled in the second hole.

In some implementations, the electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

In some implementations, the electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

In some implementations, the electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

In some implementations, the electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

In some implementations, the electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device comprising a semiconductor memory is provided. The method includes forming an interlayer dielectric layer having a hole over a substrate; forming a conductive pattern filled in the hole; amorphizing an upper portion of the conductive pattern by performing an ion implantation process so that the conductive pattern and the interlayer dielectric layer have a substantially flat top surface; and forming an MTJ (Magnetic Tunnel Junction) structure over the substantially flat top surface, the MTJ structure being coupled to the conductive pattern and including a free layer having a variable magnetization direction, a pinned layer having a pinned magnetization direction and a tunnel barrier layer interposed between the free layer and the pinned layer.

Implementations of the above method may include one or more the following.

The ion implantation process is performed in a state where a protective layer is formed over the conductive pattern and the interlayer dielectric layer. The protective layer is removed after the ion implantation process. The ion implantation process is performed on whole top surfaces of the conductive pattern and the interlayer dielectric layer. At least one dopant of Ge, Ar, Xe, In, Sb or As is implanted in the ion implantation process.

These and other aspects, implementations and associated advantages are described in greater detail in the drawings, the description and the claims.

DETAILED DESCRIPTION

Figure 1A:
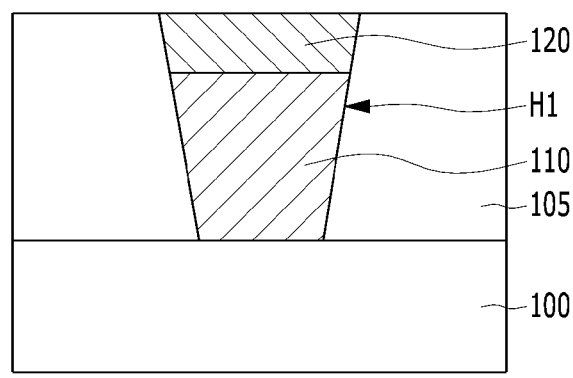
FIGS. 1A to 1C are cross-sectional views explaining a semiconductor device and an example of a method for fabricating the same in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to explaining the drawings, a semiconductor device in accordance with an implementation is briefly described. The semiconductor device may include a variable resistance element which is switched between different resistance states according to a current or voltage supplied thereto. This variable resistance element may store different data according to its resistance state, thereby serving as a memory cell. Specially, the variable resistance element may include an MTJ (Magnetic Tunnel Junction) structure. The MTJ structure may include a pinned layer including a magnetic material and having a pinned magnetization direction, a free layer including a magnetic material and having a variable magnetization direction, and a tunnel barrier layer interposed between the free layer and the pinned layer. When the magnetization directions of the pinned layer and the free layer are parallel to each other, the variable resistance element may exhibit a low resistance state and store first data, for example, data "0". On the other hand, when the magnetization directions of the pinned layer and the free layer are anti-parallel to each other, the variable resistance element may exhibit a high resistance state and store second data, for example, data "1".

In the above variable resistance element, there may be various conditions in order to satisfy required characteristics. For example, it is very important to secure flatness of layers included in the MTJ structure. This is because various characteristics of the variable resistance element are deteriorated when some layers of the MTJ structure have a bent portion or are bent. In the present implementations, the flatness of the layers of the MTJ structure may be secured by improving a structure which is located under the MTJ structure. As a result, the characteristics of the variable resistance element may be improved.

Figure 1B:
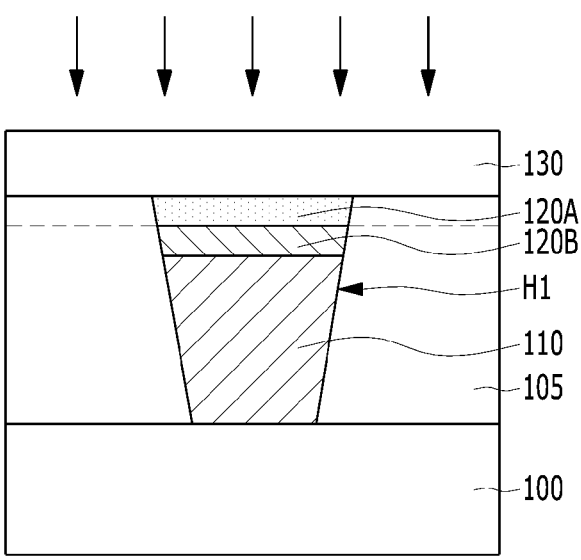
Figure 1C:
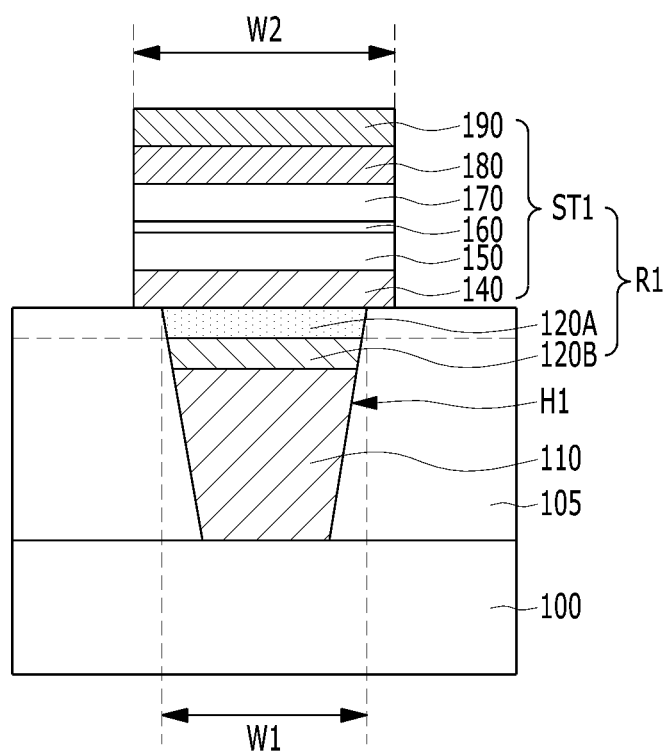

FIGS. 1A to 1C are cross-sectional views explaining a semiconductor device and an example of a method for fabricating the same in accordance with an implementation.

First, the fabricating method is described.

Referring to FIG. 1A, a substrate 100 including required elements (not shown) may be provided. For example, an access element (not shown) for controlling supply of a voltage or current to a variable resistance element may be formed in the substrate 100. The access element may include, for example, a transistor, or a diode, etc.

Then, an interlayer dielectric layer 105 may be formed over the substrate 100. Then, a hole H1 may be formed in the interlayer dielectric layer 105 by selectively etching the interlayer dielectric layer 105 to expose a portion of the substrate 100, for example, a terminal of the access element 105. Here, the interlayer dielectric layer 105 may be formed of or to include an insulating material which may be selected from various insulating materials such as a silicon oxide, a silicon nitride, etc. The hole H1 may have a circular shape or a circle-like shape in a plan view, and may have a shape which becomes narrower toward the bottom in a cross-sectional view.

Then, a contact plug 110 filling a lower portion of the hole H1 may be formed. The contact plug 110 may be formed by depositing a conductive material over a resultant structure including the hole H1 to a thickness sufficient to fill the hole H1, and performing an etch back process until a top surface of the conductive material becomes lower than a top surface of the interlayer dielectric layer 105 to a certain level. The contact plug 110 may be located under the variable resistance element to provide a path for supplying a current or voltage to the variable resistance element. That is, the contact plug 110 may have a top end coupled to the variable resistance element and a bottom end coupled to the access element. The contact plug 110 may be formed of or include a metal such as Ti, or W, and the like, or a metal nitride such as TiN, WN, TaN, or other materials.

Then, an initial lower electrode 120 filling a remaining space of the hole H1 in which the contact plug 110 is formed may be formed. The initial lower electrode 120 provides a basis for a final lower electrode to be formed (see reference numerals 120A and 120B of FIG. 1B) which will be described later. The initial lower electrode 120 may be formed by depositing a conductive material over a resultant structure including the contact plug 110 to a thickness sufficient to fill the remaining space of the hole H1, and performing a planarization process, for example, a CMP (Chemcal Mechanical Polishing) process until the top surface of the interlayer dielectric layer 105 is exposed. Therefore, the top surface of the interlayer dielectric layer 105 and a top surface of the initial lower electrode 120 may be located at the same level in a vertical direction perpendicular to a surface of the substrate 100. In this implementation, the initial lower electrode 120 may include a crystalline metal, for example, crystalline Ta.

Referring to FIG. 1B, a protective layer 130 may be formed to cover a resultant structure of FIG. 1A. The protective layer 130 is for protecting an underlying structure located under the protective layer 130 during a subsequent ion implantation process. The protective layer 130 may be formed of or include a material which is easily removed by an etching process and has an etching rate different from the interlayer dielectric layer 105, for example, a silicon oxide, a silicon nitride, or an amorphous carbon, etc.

An upper portion of the initial lower electrode 120 may be amorphized by performing an ion implantation process in a direction from top to bottom (see arrows) in a state where the protective layer 130 is formed. The upper portion of the initial lower electrode 120 which is amorphized is represented by the reference numeral 120A, and a lower portion of the initial lower electrode 120 which is located under the upper portion of the initial lower electrode 120 and maintains its previous state, for example, a crystalline state is represented by the reference numeral 120B. The reference numerals 120A and 120B may be referred to as a lower electrode. During this ion implantation, at least one dopant may be added to the upper portion of the initial lower electrode 120. Such a dopant may be, in some implementations, Ge, Ar, Xe, In, Sb or As.

A type of the dopant, energy during the ion implantation process and/or dose of the dopant may be properly adjusted according to a type of the initial lower electrode 120 and a target thickness to be amorphized.

As a result, the lower electrode 120A and 120B may be located over the contact plug 110 and filled in the hole H1 to have a sidewall aligned with the contact plug 110. The lower electrode 120A and 120B may be a part of the variable resistance element. That is, the lower electrode 120A and 120B may be located at a lowermost part of the variable resistance element and couple the contact plug 110 with the variable resistance element. Also, the lower electrode 120A and 120B may help the growth of a layer located over the lower electrode 120A and 120B so that the layer has a targeted crystalline structure. When the lower electrode 120A and 120B has an amorphous surface, flatness of layers located over the lower electrode 120A and 120B, for example, an MTJ structure can be secured. This is because the lower electrode 120A and 120B and the interlayer dielectric layer 105 have a substantially flat top surface. This will be shown in FIGS. 2A and 2B.

Furthermore, the ion implantation process may be performed on an uppermost portion of the interlayer dielectric layer 105 (see a portion located over dotted line). Therefore, the uppermost portion of the interlayer dielectric layer 105 may be in an amorphous state and include at least one dopant of Ge, Ar, Xe, In, Sb or As. The uppermost portion of the interlayer dielectric layer 105 may have a thickness same as or similar to a thickness of the upper portion 120A of the lower electrode 120A and 120B.

Referring to FIG. 1C, the protective layer 130 may be removed by a wet etching method or a dry etching method.

Then, a stack structure ST1 may be formed over a resultant structure in which the protective layer 130 is removed. The stack structure ST1 may be formed over the substantially flat top surface of the upper portion of the lower electrode 120A and 120B and the interlayer dielectric layer 105. The stack structure ST1 may include an MTJ structure 150, 160 and 170 and overlap with the hole H1 to be coupled to the lower electrode 120A and 120B. In this implementation, the stack structure ST1 may include a seed layer 140, the MTJ structure 150, 160 and 170, a capping layer 180 and an upper electrode 190 which are sequentially stacked. The stack structure ST1 may be formed by depositing material layers for forming the seed layer 140, the MTJ structure 150, 160 and 170, the capping layer 180 and the upper electrode 190, and selectively etching the material layers using a single mask. As a result, the seed layer 140, the MTJ structure 150, 160 and 170, the capping layer 180 and the upper electrode 190 may have sidewalls aligned with each other.

Here, the MTJ structure 150, 160 and 170 may include a free layer 150 which includes a magnetic material and has a variable magnetization direction, a pinned layer 170 which includes a magnetic material and has a pinned magnetization direction, and a tunnel barrier layer 160 interposed therebetween. Locations of the free layer 150 and the pinned layer 170 may be reversed with each other in the vertical direction. The free layer 150 may store different data according to its magnetization direction and be referred to as a storage layer, etc. The pinned layer 170 may be compared with the free layer 150 and be referred to as a reference layer, etc. Each of the free layer 150 and the pinned layer 170 may have a single-layered structure or a multi-layered structure including a ferromagnetic material. The ferromagnetic material may include an Fe—Pt alloy, an Fe—Pd alloy, a Co—Pd alloy, a Co—Pt alloy, an Fe—Ni—Pt alloy, a Co—Fe—Pt alloy, or a Co—Ni—Pt alloy, etc, and further include impurities such as B. However, other implementations may be also possible. The magnetization directions of the free layer 150 and the pinned layer 170 may be substantially perpendicular to surfaces of the free layer 150 and the pinned layer 170. The tunnel barrier layer 160 may change the magnetization direction of the free layer 150 by tunneling of electrons. The tunnel barrier layer 160 may have a single-layered structure or a multi-layered structure including an oxide such as $Al_2O_3$, MgO, CaO, SrO, TiO, VO, or NbO, etc. However, other implementations may be also possible.

The seed layer 140 may serve to help the growth of a layer located over the seed layer 140, for example, the free layer 150 so that the layer has a targeted crystalline structure. The seed layer 140 may be formed of or include a metal such as Ru, or Ta, etc.

The capping layer 180 may cover a top surface of the pinned layer 170 to divide a magnetic material from a material located over the magnetic material. Furthermore, the capping layer 180 may serve as a hard mask in the etching process for forming the stack structure ST1. The capping layer 180 may be formed of or include a nonmagnetic conductive material, for example, a metal such as Ru, or Ta, etc.

The upper electrode 190 may be located at an uppermost portion of the variable resistance element and couple the variable resistance element to another contact plug (now shown) which is located over the upper electrode 190. The upper electrode 190 may be formed of or include a material same as or similar to the initial lower electrode 120, for example, a crystalline metal, etc.

However, the structure explained above is an example of the stack structure ST1 and the stack structure ST1 can have other structures. For example, The stack structure ST1 may include various types of multi-layered structures as long as the stack structure ST1 includes the MTJ structure 150, 160 and 170.

By the aforementioned processes, the semiconductor device of FIG. 1C may be fabricated.

Referring again to FIG. 1C, the substrate 100 including the required elements (not shown), the interlayer dielectric layer 105 which is formed over the substrate 100 and has the hole H1 exposing the portion of the substrate 100, the contact plug 110 filling the lower portion of the hole H1, the lower electrode 120A and 120B formed over the contact plug 110 and filling the upper portion of the hole H1, and the stack structure ST1 which is formed over the lower electrode 120A and 120B to be coupled to the lower electrode 120A and 120B and includes the MTJ structure 150, 160 and 170. The lower electrode 120A and 120B and the stack structure ST1 may form a variable resistance element R1 as a unit. Therefore, in this implementation, the lower electrode 120A and 120B corresponding to a lowermost portion of the variable resistance element R1 may be buried inside the interlayer dielectric layer 105.

Here, the upper portion 120A of the lower electrode 120A and 120B may be in an amorphous state and include at least one dopant of Ge, Ar, Xe, In, Sb or As. Furthermore, the uppermost portion of the interlayer dielectric layer 105 may be in an amorphous state and include a dopant same as the upper portion 120A of the lower electrode 120A and 120B.

The stack structure ST1 may overlap with the hole H1 and have a width W2 which is greater than a width W1 of a top of the hole H1. Therefore, the stack structure ST1 may cover a whole top surface of the upper portion 120A of the lower electrode 120A and 120B, and a top surface of an area adjacent to the lower electrode 120A and 120B.

The above implementation may be used to achieve one or more following advantages.

First, although the stack structure ST1 has a width greater than a width of the hole H1, flatness of layers included in the stack structure ST1 including the MTJ structure 150, 160 and 170 may be secured. This is because a surface of the lower electrode 120A and 120B and/or a surface of the interlayer dielectric layer 105 located at the same level as the surface of the lower electrode 120A and 120B are in the amorphous state. If the surface of the lower electrode 120A and 120B and/or the surface of the interlayer dielectric layer 105 are in a crystalline state, the layers included in the stack structure ST1 may be bent over the lower electrode 120A and 120B or be bent over a boundary of the lower electrode 120A and 120B and the interlayer dielectric layer 105, thereby deteriorating characteristics of the variable resistance element R1. However, by this implementation, it is possible to prevent deterioration of the characteristics of the variable resistance element R1. This has been demonstrated experimentally as shown in FIGS. 2A and 2B.

Figure 2A:
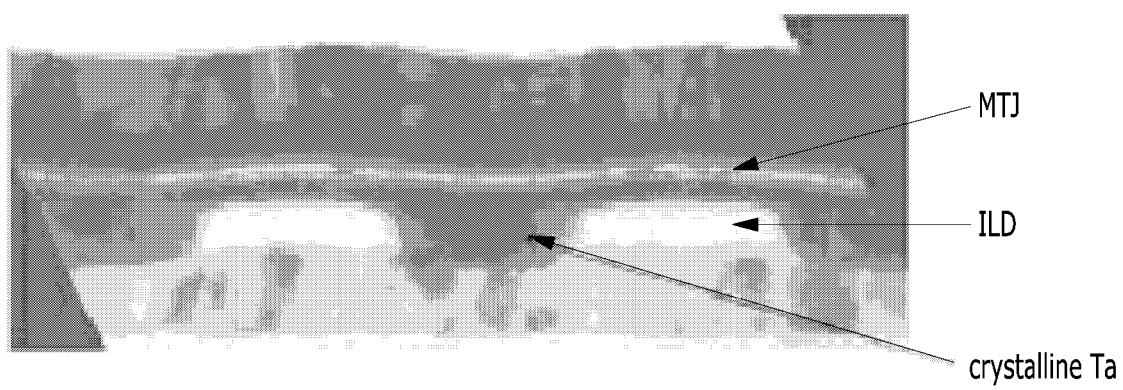
FIG. 2A is a cross-sectional view showing a conventional semiconductor device.
Figure 2B:
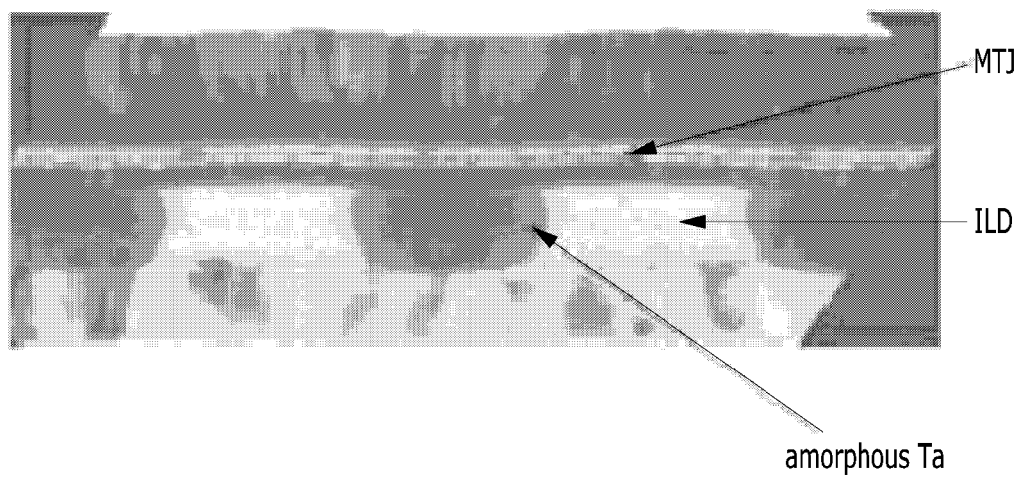
FIG. 2B is a cross-sectional view showing a semiconductor device in accordance with an implementation.

FIG. 2A is a cross-sectional view showing a conventional semiconductor device, and FIG. 2B is a cross-sectional view showing a semiconductor device in accordance with an implementation. Specifically, FIG. 2A shows a semiconductor device which is not accompanied by an ion implantation process and includes an MTJ structure formed over an interlayer dielectric layer ILD and a crystalline Ta layer. On the other hand, FIG. 2B shows a semiconductor device which is accompanied by an ion implantation process and includes an MTJ structure formed over an interlayer dielectric layer ILD and an amorphous Ta layer, as described above. Specially, FIG. 2B shows a case that Ge is implanted.

Referring to FIG. 2A, the MTJ structure is bent over the crystalline Ta layer, and is further bent over a boundary of the crystalline Ta layer and the interlayer dielectric layer ILD.

On the other hand, referring to FIG. 2B, the MTJ structure has better flatness over the amorphous Ta, compared to the MTJ structure of FIG. 2A. Further, the MTJ structure of FIG. 2B has better flatness over a boundary of the amorphous Ta and the interlayer dielectric layer ILD, compared to the MTJ structure of FIG. 2A.

Further, since the flatness is secured as shown in FIG. 2B, the width of the stack structure ST1 can be greater than the width of the hole H1. Therefore, alignment margin between the hole H1 and the stack structure ST1 can be secured. Also, it is possible to prevent a material of the lower electrode 120A and 120B from being re-deposited on a sidewall of the stack structure ST1. Thus, an electrical short between the free layer 150 and the pinned layer 170 which should be electrically insulated from each other can be prevented.

Furthermore, the semiconductor device of the implementation may be obtained by only adding the ion implantation process, so level of difficulty of processes may be low.

Figure 3:
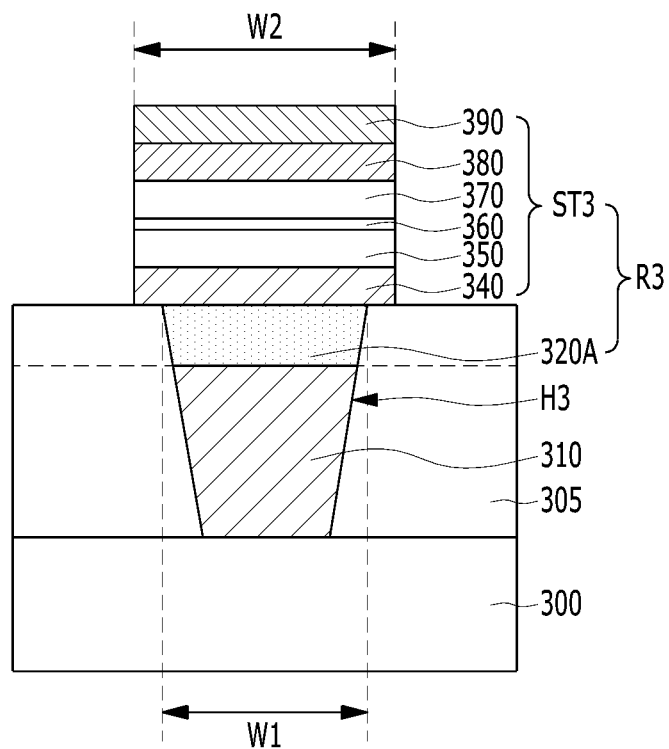
FIG. 3 is a cross-sectional view explaining a semiconductor device and an example of a method for fabricating the same in accordance with another implementation.

FIG. 3 is a cross-sectional view explaining a semiconductor device and an example of a method for fabricating the same in accordance with another implementation. Differences from the above implementation will be mainly described.

Referring to FIG. 3, an interlayer dielectric layer 305 having a hole H3 may be formed over a substrate 300, and then, a contact plug 310 filling a lower portion of the hole H3 may be formed.

Then, an initial lower electrode 320A filling an upper portion of the hole H3 may be formed. Next, the lower electrode 320A may be formed by amorphizing a whole of the initial lower electrode through an ion implantation process to provide a substantially flat top surface. Such ion implantation process may be performed in a state where a protective layer (not shown) is formed. The lower electrode 320A may include a dopant implanted thereto, for example, at least one of Ge, Ar, Xe, In, Sb or As. Here, an uppermost portion of the interlayer dielectric layer 305 (see a portion located over dotted line) may be also amorphized by the ion implantation process. A thickness of the uppermost portion of the interlayer dielectric layer 305 may be same as or similar to a thickness of a whole of the lower electrode 320A.

Then, a stack structure ST3 including a seed layer 340, an MTJ structure 350, 360 and 370, a capping layer 380 and an upper electrode 390 may be formed. In one implementation, the stack structure ST3 may be formed over the substantially flat top surface. As a result, a device shown in FIG. 3 can be obtained.

In the present implementation, unlike the above implementation, the whole of the lower electrode 320A may be in an amorphous state. In this case, since the device includes a surface of the lower electrode 320A and/or a surface of the interlayer dielectric layer 305 that are still amorphous, the substantially same effects as the above implementation may be obtained.

FIGS. 4A to 4D are cross-sectional views explaining a semiconductor device and an example of a method for fabricating the same in accordance with another implementation. Referring to FIGS. 4A to 4D, differences from the above implementations will be mainly described.

Figure 4A:
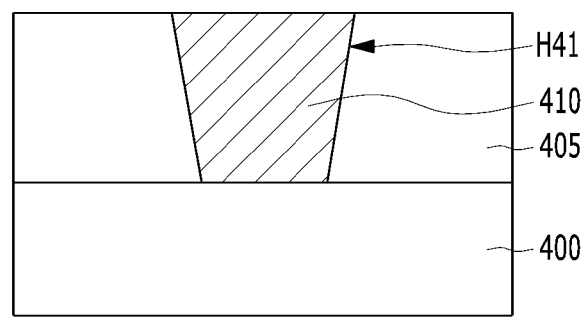
FIGS. 4A to 4D are cross-sectional views explaining a semiconductor device and an example of a method for fabricating the same in accordance with another implementation.

Referring to FIG. 4A, a first interlayer dielectric layer 405 having a first hole H41 may be formed over a substrate 400, and then, a contact plug 410 may be formed in the first hole H41. The contact plug 410 may be formed by depositing a conductive material over a resultant structure in which the first hole H41 is formed to a thickness sufficient to fill the first hole H41, and performing a planarization process until a top surface of the first interlayer dielectric layer 405 is exposed.

Figure 4B:
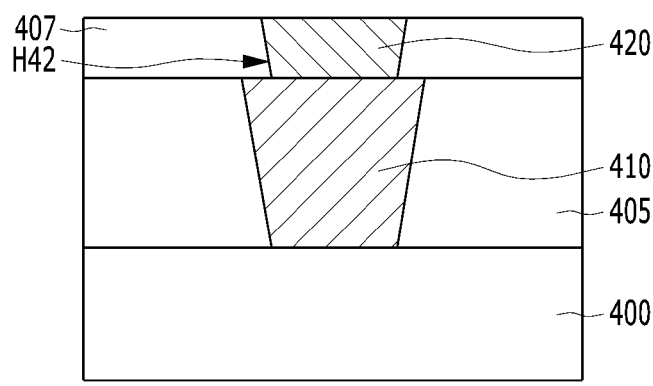

Referring to FIG. 4B, a second interlayer dielectric layer 407 may be formed over the first interlayer dielectric layer 405 and the contact plug 410, and a second hole H42 which overlaps with the first hole H41 and exposes at least a part of the contact plug 410 may be formed by selectively etching the second interlayer dielectric layer 407.

Then, an initial lower electrode 420 may be formed in the second hole H42. The initial lower electrode 420 may be formed by depositing a conductive material over a resultant structure in which the second hole H42 is formed to a thickness sufficient to fill the second hole H42, and performing a planarization process until a top surface of the second interlayer dielectric layer 407 is exposed.

Figure 4C:
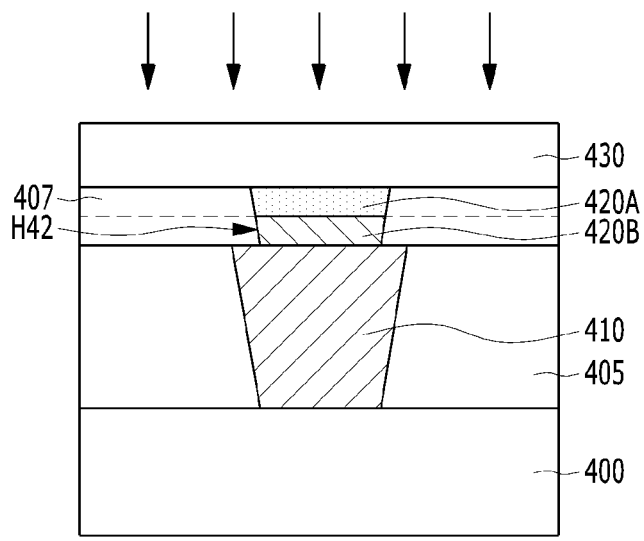

Referring to FIG. 4C, an ion implantation process may be performed on an upper portion of the initial lower electrode 420 in a state where a protective layer 430 is formed to form a lower electrode 420A and 420B. The upper portion 420A of the lower electrode 420A and 420B may be in an amorphous state, and the lower portion 420B of the lower electrode 420A and 420B may maintain its previous state, for example, a crystalline state. In one implementation, the upper portion 420A of the lower electrode 420A and 420B and the second interlayer dielectric layer 407 have a substantially flat top surface. The ion implantation process may be performed differently from the implementation as shown in FIG. 4C. For example, a whole of the initial lower electrode 420 may be amorphized by the ion implantation process.

Figure 4D:
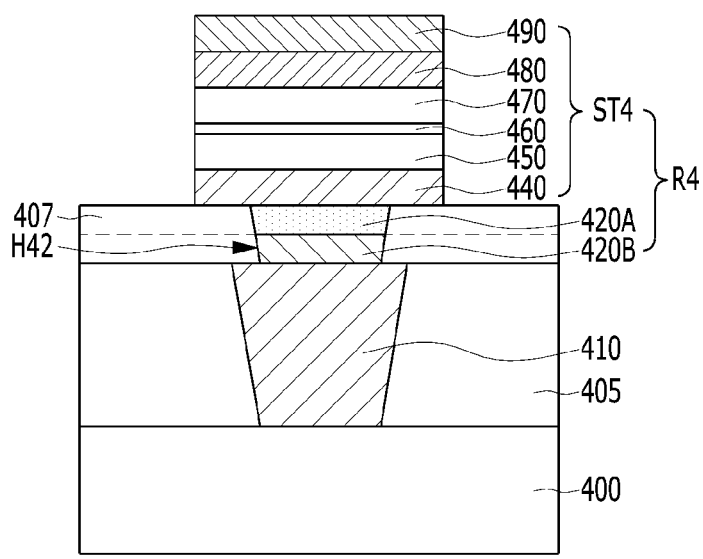

Referring to FIG. 4D, a stack structure ST4 including a seed layer 440, an MTJ structure 450, 460 and 470, a capping layer 480 and an upper electrode 490 may be formed over a resultant structure in which the protective layer 430 is removed. In one implementation, the stack structure ST4 may be formed over the substantially flat top surface. As a result, a device as shown in FIG. 4D may be obtained.

In the present implementation, although the lower electrode 420A and 420B are formed over the contact plug 410, a sidewall of the lower electrode 420A and 420B are not aligned with the contact plug 410.

Figure 5A:
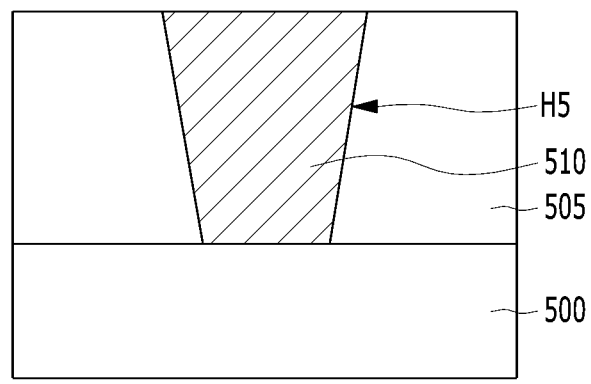
FIGS. 5A to 5C are cross-sectional views explaining a semiconductor device and an example of a method for fabricating the same in accordance with another implementation.
Figure 5B:
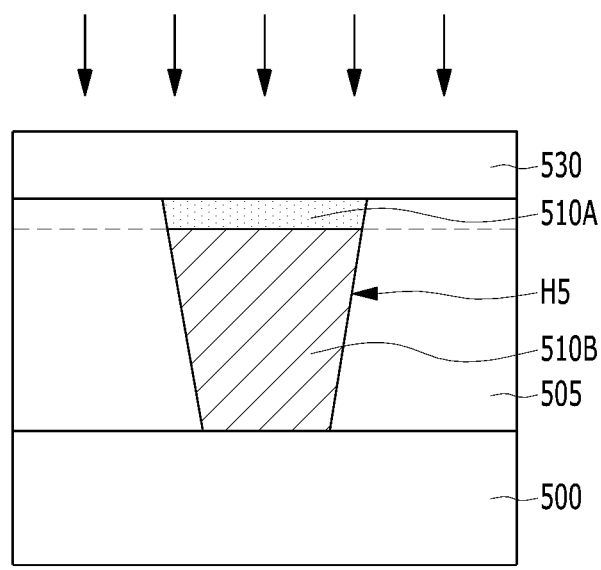
Figure 5C:
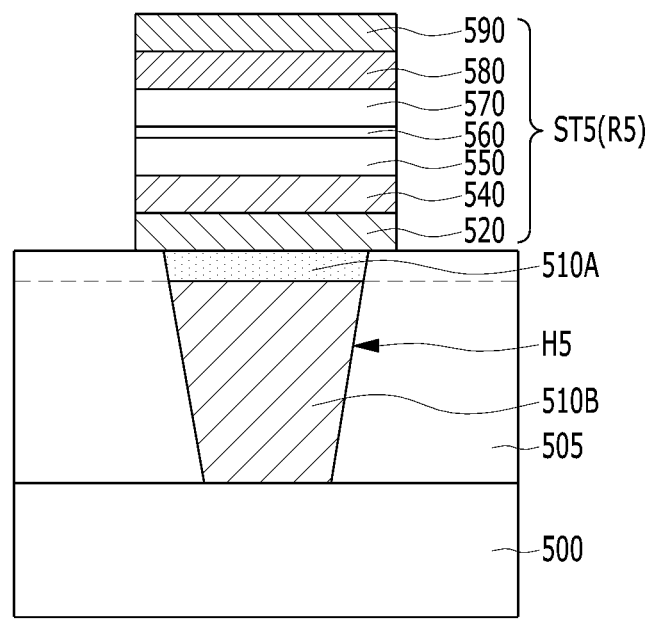

FIGS. 5A to 5C are cross-sectional views explaining a semiconductor device and an example of a method for fabricating the same in accordance with another implementation. Differences from the above implementations will be mainly described.

Referring to FIG. 5A, an interlayer dielectric layer 505 having a hole H5 may be formed over a substrate 500, and then, an initial contact plug 510 filled in the hole H5 may be formed.

Referring to FIG. 5B, an ion implantation process may be performed to amorphize an uppermost portion of the initial contact plug 510. The ion implantation process is performed in a state where a protective layer 530 is formed over the interlayer dielectric layer 505 and the initial contact plug 510. Here, an uppermost portion of the interlayer dielectric layer 505 (see a portion located over dotted line) may be amorphized by the ion implantation process. As a result, a contact plug 510A and 510B including an upper portion 510A which is amorphous and a lower portion 510B which maintains its previous state, for example, a crystalline state may be formed. In one implementation, the upper portion 510A and the interlayer dielectric layer 505 have a substantially flat top surface.

Referring to FIG. 5C, a stack structure ST5 including a lower electrode 520, a seed layer 540, an MTJ structure 550, 560 and 570, a capping layer 580 and an upper electrode 590 may be formed over a resultant structure in which the protective layer 530 is removed. In one implementation, the stack structure ST5 may be formed over the substantially flat top surface. As a result, a device shown in FIG. 5C may be obtained.

In the present implementation, unlike the above implementations, the lower electrode 520 may be located over the interlayer dielectric layer 505 and have a sidewall aligned with sidewalls of other layers of the stack structure ST5. That is, the stack structure ST5 located over the interlayer dielectric layer 505 may correspond to a variable resistance element R5. In this case, since a surface of the contact plug 510A and 510B and/or a surface of the interlayer dielectric layer 505 which is located at the same level as the surface of the contact plug 510A and 510B are still amorphous, the same effects as the above implementation can be obtained.

The above and other memory circuits or semiconductor devices based on the disclosed technology can be used in a range of devices or systems. FIGS. 6-10 provide some examples of devices or systems that can implement the memory circuits disclosed herein.

Figure 6:
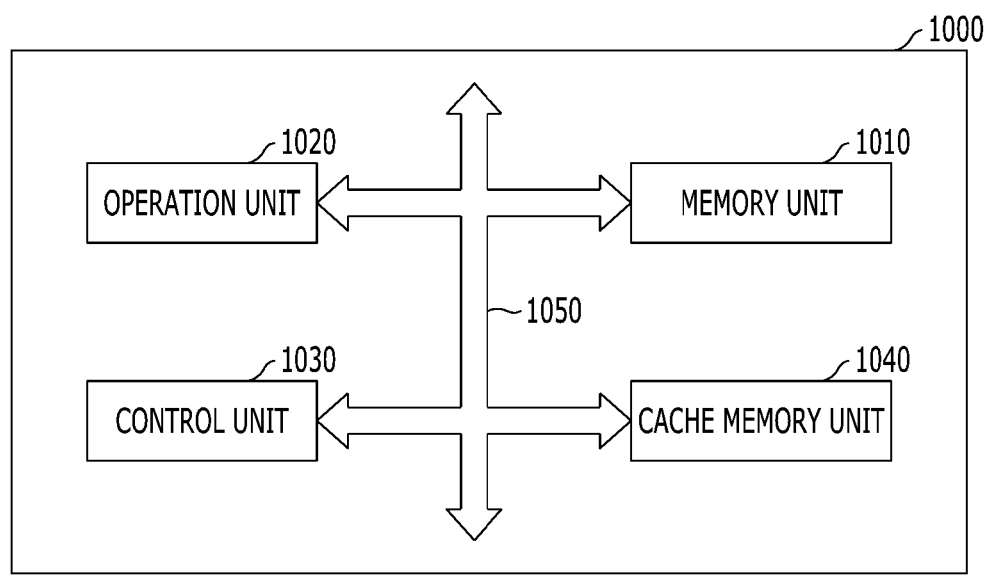
FIG. 6 is an example of configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include an interlayer dielectric layer formed over a substrate and having a hole; a conductive pattern filled in the hole and having a top surface located at a level substantially same as a top surface of the interlayer dielectric layer; and an MTJ (Magnetic Tunnel Junction) structure formed over the conductive pattern to be coupled to the conductive pattern and including a free layer having a variable magnetization direction, a pinned layer having a pinned magnetization direction and a tunnel barrier layer interposed between the free layer and the pinned layer, wherein an upper portion of the conductive pattern includes a first amorphous region. Through this, a level of difficulty of fabricating processes of the memory unit 1010 may be decreased and data storage characteristics of the memory unit 1010 may be improved. As a consequence, it is possible to improve operating characteristics of the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
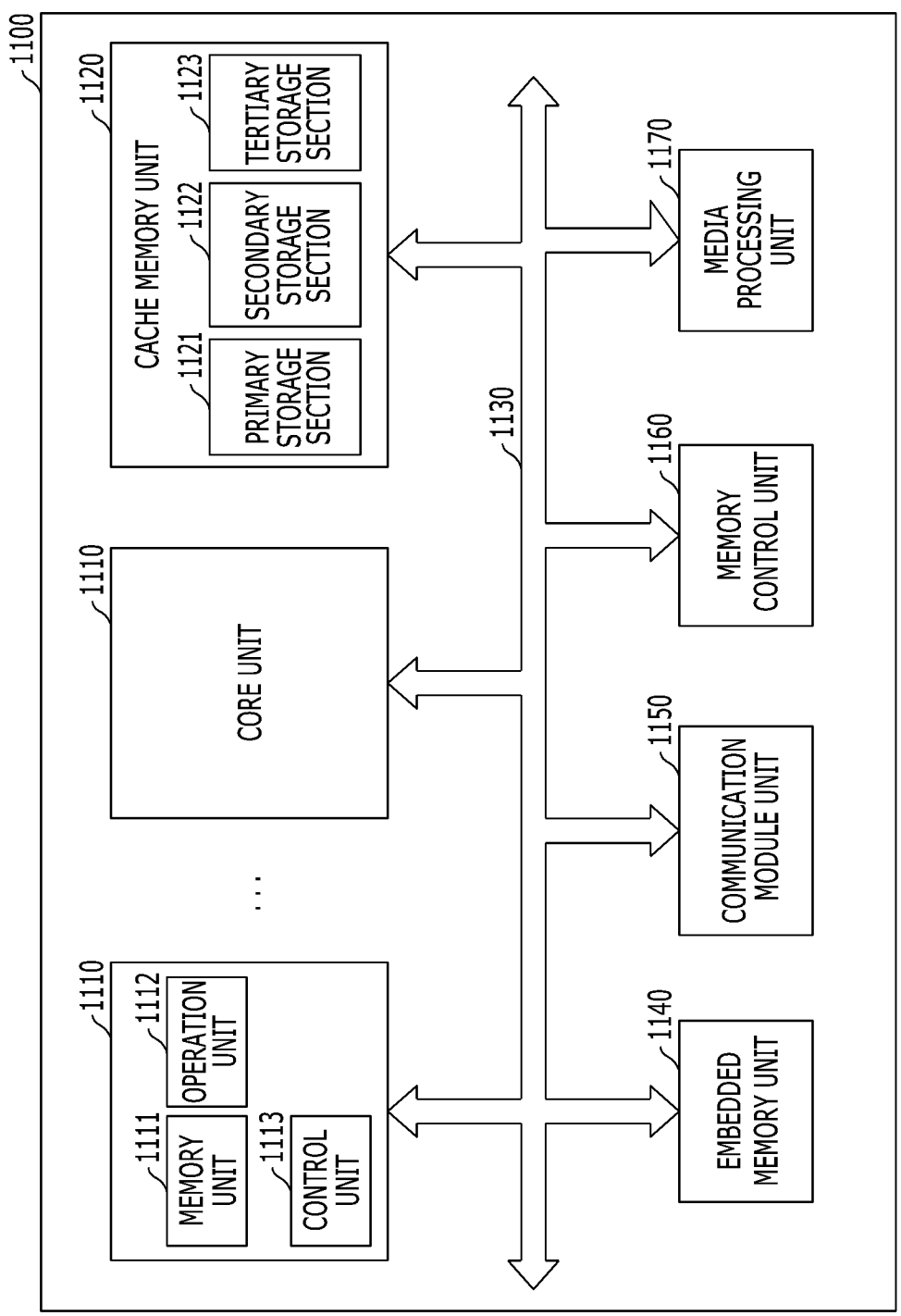
FIG. 7 is an example of configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include an interlayer dielectric layer formed over a substrate and having a hole; a conductive pattern filled in the hole and having a top surface located at a level substantially same as a top surface of the interlayer dielectric layer; and an MTJ (Magnetic Tunnel Junction) structure formed over the conductive pattern to be coupled to the conductive pattern and including a free layer having a variable magnetization direction, a pinned layer having a pinned magnetization direction and a tunnel barrier layer interposed between the free layer and the pinned layer, wherein an upper portion of the conductive pattern includes a first amorphous region. Through this, a level of difficulty of fabricating processes of the cache memory unit 1120 may be decreased and data storage characteristics of the cache memory unit 1120 may be improved. As a consequence, it is possible to improve operating characteristics of the processor 1100.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
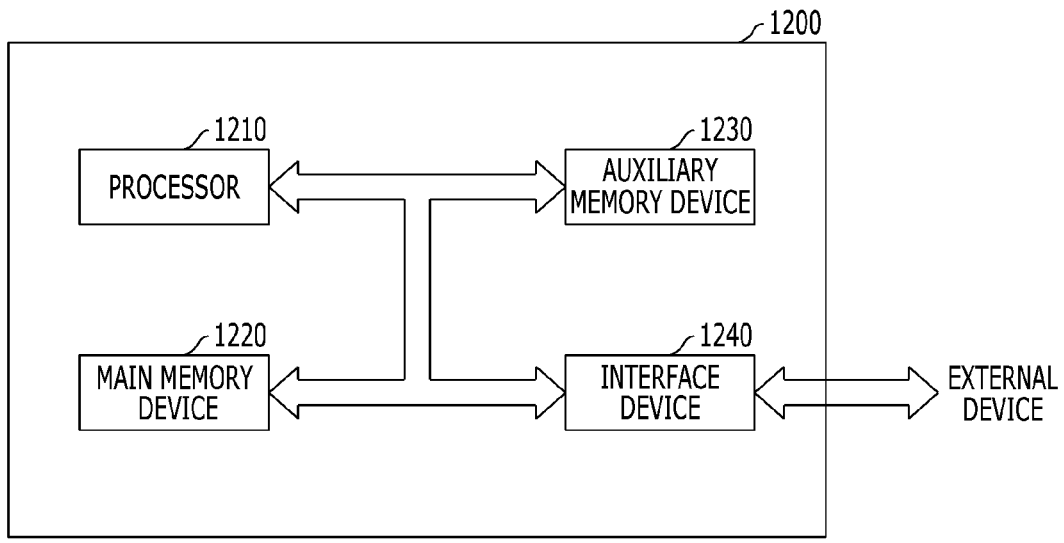
FIG. 8 is an example of configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include an interlayer dielectric layer formed over a substrate and having a hole; a conductive pattern filled in the hole and having a top surface located at a level substantially same as a top surface of the interlayer dielectric layer; and an MTJ (Magnetic Tunnel Junction) structure formed over the conductive pattern to be coupled to the conductive pattern and including a free layer having a variable magnetization direction, a pinned layer having a pinned magnetization direction and a tunnel barrier layer interposed between the free layer and the pinned layer, wherein an upper portion of the conductive pattern includes a first amorphous region. Through this, a level of difficulty of fabricating processes of the main memory device 1220 may be decreased and data storage characteristics of the main memory device 1220 may be improved. As a consequence, it is possible to improve operating characteristics of the system 1200.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include an interlayer dielectric layer formed over a substrate and having a hole; a conductive pattern filled in the hole and having a top surface located at a level substantially same as a top surface of the interlayer dielectric layer; and an MTJ (Magnetic Tunnel Junction) structure formed over the conductive pattern to be coupled to the conductive pattern and including a free layer having a variable magnetization direction, a pinned layer having a pinned magnetization direction and a tunnel barrier layer interposed between the free layer and the pinned layer, wherein an upper portion of the conductive pattern includes a first amorphous region. Through this, a level of difficulty of fabricating processes of the auxiliary memory device 1230 may be decreased and data storage characteristics of the auxiliary memory device 1230 may be improved. As a consequence, it is possible to improve operating characteristics of the system 1200.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
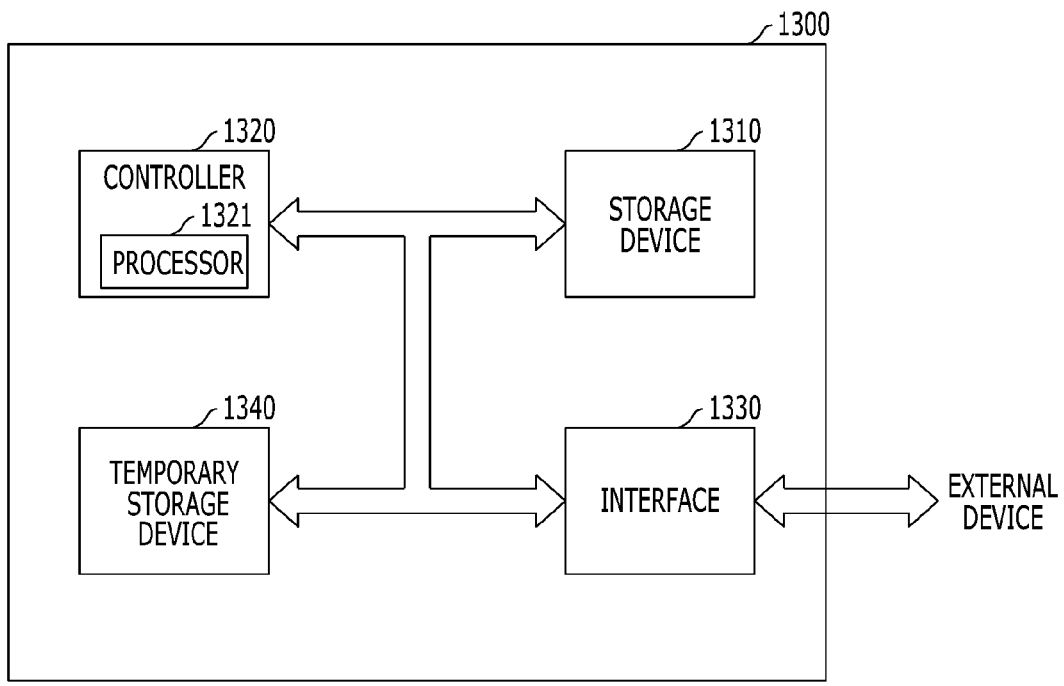
FIG. 9 is an example of configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include an interlayer dielectric layer formed over a substrate and having a hole; a conductive pattern filled in the hole and having a top surface located at a level substantially same as a top surface of the interlayer dielectric layer; and an MTJ (Magnetic Tunnel Junction) structure formed over the conductive pattern to be coupled to the conductive pattern and including a free layer having a variable magnetization direction, a pinned layer having a pinned magnetization direction and a tunnel barrier layer interposed between the free layer and the pinned layer, wherein an upper portion of the conductive pattern includes a first amorphous region. Through this, a level of difficulty of fabricating processes of the storage device 1310 or the temporary storage device 1340 may be decreased and data storage characteristics of the storage device 1310 or the temporary storage device 1340 may be improved. As a consequence, it is possible to improve operating characteristics and data storage characteristics of the data storage system 1300.

Figure 10:
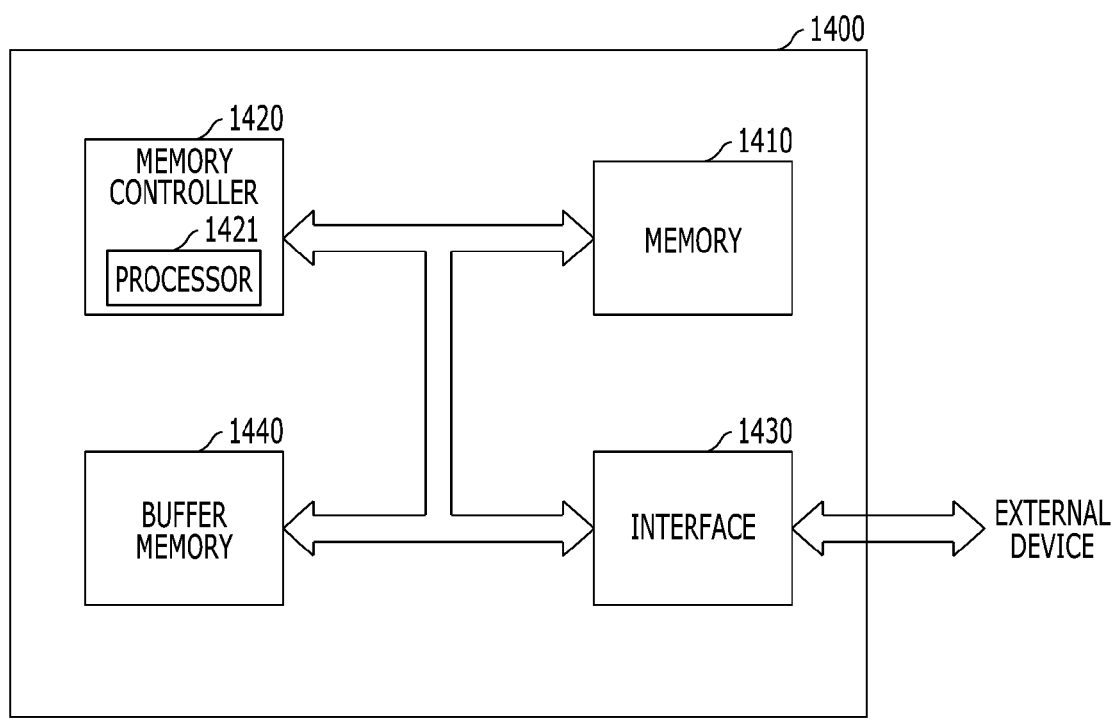
FIG. 10 is an example of configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on.

The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include an interlayer dielectric layer formed over a substrate and having a hole; a conductive pattern filled in the hole and having a top surface located at a level substantially same as a top surface of the interlayer dielectric layer; and an MTJ (Magnetic Tunnel Junction) structure formed over the conductive pattern to be coupled to the conductive pattern and including a free layer having a variable magnetization direction, a pinned layer having a pinned magnetization direction and a tunnel barrier layer interposed between the free layer and the pinned layer, wherein an upper portion of the conductive pattern includes a first amorphous region. Through this, a level of difficulty of fabricating processes of the memory 1410 may be decreased and data storage characteristics of the memory 1410 may be improved. As a consequence, it is possible to improve operating characteristics and data storage characteristics of the memory system 1400.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include an interlayer dielectric layer formed over a substrate and having a hole; a conductive pattern filled in the hole and having a top surface located at a level substantially same as a top surface of the interlayer dielectric layer; and an MTJ (Magnetic Tunnel Junction) structure formed over the conductive pattern to be coupled to the conductive pattern and including a free layer having a variable magnetization direction, a pinned layer having a pinned magnetization direction and a tunnel barrier layer interposed between the free layer and the pinned layer, wherein an upper portion of the conductive pattern includes a first amorphous region. Through this, a level of difficulty of fabricating processes of the buffer memory 1440 may be decreased and data storage characteristics of the buffer memory 1440 may be improved. As a consequence, it is possible to improve operating characteristics and data storage characteristics of the memory system 1400.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory includes:
   an interlayer dielectric layer formed over a substrate and having a hole;
   a conductive pattern filled in the hole and having a top surface located at a level substantially same as a top surface of the interlayer dielectric layer; and
   an MTJ (Magnetic Tunnel Junction) structure formed over the conductive pattern to be coupled to the conductive pattern and including a free layer having a variable magnetization direction, a pinned layer having a pinned magnetization direction and a tunnel barrier layer interposed between the free layer and the pinned layer,
   wherein an upper portion of the conductive pattern includes a first amorphous region.

2. The electronic device of claim 1, wherein the first amorphous region includes Ge, Ar, Xe, In, Sb or As as a dopant.

3. The electronic device of claim 1, wherein an upper portion of the interlayer dielectric layer includes a second amorphous region.

4. The electronic device of claim 3, wherein the second amorphous region includes Ge, Ar, Xe, In, Sb or As as a dopant.

5. The electronic device of claim 3, wherein the upper portion of the conductive pattern and the upper portion of the interlayer dielectric layer have the same dopant.

6. The electronic device of claim 3, wherein the upper portion of the conductive pattern and the upper portion of the interlayer dielectric layer have the substantially same thickness.

7. The electronic device of claim 1, wherein the MTJ structure covers the whole top surface of the conductive pattern.

8. The electronic device of claim 1, wherein the conductive pattern includes a first conductive pattern filling a lower portion of the hole and a second conductive pattern filling an upper portion of the hole, and
   the second conductive pattern forms a variable resistance element together with the MTJ structure.

9. The electronic device of claim 8, wherein the upper portion of the conductive pattern corresponds to a part or a whole of the second conductive pattern.

10. The electronic device of claim 8, wherein the hole includes a first hole and a second hole located over the first hole,
the second hole has a sidewall which is not aligned with the first hole,
the first conductive pattern is filled in the first hole, and the second conductive pattern is filled in the second hole.

11. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory is part of the memory unit in the microprocessor.

12. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory is part of the cache memory unit in the processor.

13. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory is part of the auxiliary memory device or the main memory device in the processing system.

14. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory is part of the storage device or the temporary storage device in the data storage system.

15. The electronic device according to claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory is part of the memory or the buffer memory in the memory system.

16. A method for fabricating an electronic device comprising a semiconductor memory, comprising:
forming an interlayer dielectric layer having a hole over a substrate;
forming a conductive pattern filled in the hole;
amorphizing an upper portion of the conductive pattern by performing an ion implantation process so that the conductive pattern and the interlayer dielectric layer have a substantially flat top surface; and
forming an MTJ (Magnetic Tunnel Junction) structure over the substantially flat top surface, the MTJ structure being coupled to the conductive pattern and including a free layer having a variable magnetization direction, a pinned layer having a pinned magnetization direction and a tunnel barrier layer interposed between the free layer and the pinned layer.

17. The method of claim 16, wherein the ion implantation process is performed in a state where a protective layer is formed over the conductive pattern and the interlayer dielectric layer.

18. The method of claim 17, wherein the protective layer is removed after the ion implantation process.

19. The method of claim 16, wherein the ion implantation process is performed on whole top surfaces of the conductive pattern and the interlayer dielectric layer.

20. The method of claim 16, wherein at least one dopant of Ge, Ar, Xe, In, Sb or As is implanted in the ion implantation process.

* * * * *